US011800278B2

(12) United States Patent
Christensen et al.

(10) Patent No.: US 11,800,278 B2
(45) Date of Patent: Oct. 24, 2023

(54) MICROPHONE ASSEMBLY WITH ACOUSTIC FILTER

(71) Applicant: GN Hearing A/S, Ballerup (DK)

(72) Inventors: René Christensen, Valby (DK); Nikolaj Christiansen, Valby (DK); Emil Holm Knudsen, Copenhagen (DK); Gojko Obradovic, Copenhagen (DK)

(73) Assignee: GN HEARING A/S, Ballerup (DK)

( * ) Notice: Subject to any disclaimer, the term of this patent is extended or adjusted under 35 U.S.C. 154(b) by 27 days.

(21) Appl. No.: 17/549,858

(22) Filed: Dec. 13, 2021

(65) Prior Publication Data

US 2022/0210547 A1 Jun. 30, 2022

(30) Foreign Application Priority Data

Dec. 31, 2020 (EP) ..................................... 20218015

(51) Int. Cl.
*H04R 1/28* (2006.01)
*H04R 1/04* (2006.01)
*H04R 1/08* (2006.01)

(52) U.S. Cl.
CPC ............. *H04R 1/2884* (2013.01); *H04R 1/04* (2013.01); *H04R 1/08* (2013.01)

(58) Field of Classification Search
CPC .... H04R 1/222; H04R 1/2869; H04R 1/2884; H04R 19/005; H04R 19/016; H04R 19/04; H04R 2201/003
See application file for complete search history.

(56) References Cited

U.S. PATENT DOCUMENTS 3,819,879 A * 6/1974 Baechtold .............. H04R 1/225
381/353
10,237,668 B2 * 3/2019 Lesso ................. G01N 29/4427
(Continued)

FOREIGN PATENT DOCUMENTS

| CN | 202663539 | 1/2013 |
| KR | 2020 0040958 | 4/2020 |
| WO | WO 2018/026657 | 2/2018 |

OTHER PUBLICATIONS

Partial European Search Report for EP Patent Appln. No. 20218015.4 dated Jun. 8, 2021.
(Continued)

*Primary Examiner* — Ryan Robinson
(74) *Attorney, Agent, or Firm* — Vista IP Law Group, LLP

(57) ABSTRACT

A microphone assembly includes: a microphone with a first acoustic port, wherein the microphone is configured to convert acoustic waves into an electric signal; a filter housing with a second acoustic port; and a carrier coupled to the microphone and to the filter housing, wherein the carrier and the filter housing together enclose a cavity with a first acoustic passage fluidly connecting the first acoustic port and the second acoustic port; wherein the cavity comprises an acoustic chamber and a second acoustic passage; and wherein the second acoustic passage is in fluid communication with the first acoustic passage and with the acoustic chamber, and wherein the acoustic chamber and the second acoustic passage together establish a Helmholtz resonator for suppressing acoustic energy within a first frequency band in the acoustic waves propagating through the first acoustic passage, wherein the first frequency band is in an ultrasound frequency domain.

29 Claims, 5 Drawing Sheets

(56) References Cited

U.S. PATENT DOCUMENTS

| | | |
|---|---|---|
| 10,591,326 B2* | 3/2020 | Lim .................... G01L 19/0636 |
| 2012/0027240 A1 | 2/2012 | Chen |
| 2013/0034257 A1* | 2/2013 | Doller .................. H04R 19/005 |
| | | 381/361 |
| 2018/0233827 A1 | 8/2018 | Agranat |
| 2021/0204056 A1* | 7/2021 | Bradt ....................... H04R 1/04 |
| 2022/0353606 A1* | 11/2022 | Terashima ........... H04R 19/005 |
| 2022/0369025 A1* | 11/2022 | Neumaier ............ H04R 19/005 |

OTHER PUBLICATIONS

English Translation of CN Patent No. 202663539.
English Translation of KR Patent No. 2020 0040958.

* cited by examiner

MICROPHONE ASSEMBLY WITH ACOUSTIC FILTER

RELATED APPLICATION DATA

This application claims priority to, and the benefit of, European patent application No. 20218015.4 filed on Dec. 31, 2020. The entire disclosure of the above application is expressly incorporated by reference herein.

FIELD

The present disclosure relates to a microphone assembly with an acoustic filter, and also relates to system and method for reducing undesired influence from ultrasound in the environment on audio signals picked up by hearing aids, headsets, and other listening devices.

BACKGROUND

Ultrasonic sensors based on emission and reception of ultrasonic acoustic waves are increasingly used in e.g. driver assist systems that inform vehicle drivers of obstacles in the environment. To obtain a good accuracy and sufficient range, relatively strong acoustic wave signals may be emitted in the ultrasonic range. The relatively strong acoustic wave signals propagate through air in the environment surrounding the ultrasonic sensor. A person is not normally able to hear these ultrasonic signals, despite being present in the environment surrounding the ultrasonic sensor, since they occur at frequencies above the human hearing frequency range.

However, listening devices such as hearing aids, headsets and other types of electronic devices capturing acoustic waves from the environment, are also used in many situations in everyday life. Listening devices are often worn by a user and are increasingly becoming more and more compact and may have a very small size. Therefore, miniature microphones, or arrays of miniature microphones, are often used. The small size typically renders such microphones sensitive to ultrasonic sound. Many microphones, as an example so-called MEMS microphones, have a wide bandwidth and reach upper cut-off frequencies in the ultrasonic range, such as in the range of 30-60 KHz.

In situations wherein the listening devices are in the surroundings of ultrasonic sensors emitting ultrasonic waves, there is a significant risk of overloading the microphones. Due to such overload, users of e.g. hearing aids and headsets have been complaining about their listening devices picking up these ultrasonic signals and reproducing them as annoying audible artefacts. Such artefacts may be caused by clipping and distortion in the electric microphone audio signal reproduced by the microphone. In the case of digital listening devices, employing analogue-to-digital conversion, e.g. integrated with the microphone, it is also observed that strong aliasing effects may occur so that aliases of the ultrasonic frequencies appear at much lower, possibly audible, frequencies.

There is thus a need for solutions that reduce these unpleasant audible effects caused by strong ultrasonic, acoustic wave signals. In particular, there is a need for improvements related to passive or acoustic suppression of ultrasonic acoustic wave signals. Electronic or active suppression may be less desirable since electronic filters will not prevent the microphone from saturating in the first place.

BACKGROUND ART

US 2013/0129136 A1 (assigned on its face to Analog Devices Inc.) discloses a microphone module that has a substrate with an aperture to allow sound waves to pass through the substrate, a lid mounted to the substrate to define a first interior volume, and a microphone mounted to the substrate within the first interior volume. Thereby a bottom-port microphone is provided. Further, the microphone module includes a housing coupled to the substrate and covering the aperture. The housing forms a second interior volume and includes an acoustic port configured to allow sound to enter the second interior volume. The module further includes a pipe extending from the acoustic port in the housing, and at least one exterior interface pad outside of the second interior volume. The pipe has an open end to receive sound waves and direct them toward the acoustic port in the housing. This microphone module allegedly solves some problems related to placement of the microphone within a host system and aims to ensure that acoustic signals can reach the microphone.

However, problems related to suppression of strong ultrasound signals remain.

SUMMARY

It is an object to provide a microphone assembly with an acoustic filter without some disadvantages of prior art microphone assemblies.

These and other objects are achieved by one or more embodiments described herein.

Within this document, the singular forms "a", "an", and "the" specify the presence of a respective entity, such as a feature, an operation, an element or a component, but do not preclude the presence or addition of further entities. Likewise, the words "have", "include" and "comprise" specify the presence of respective entities, but do not preclude the presence or addition of further entities. The term "and/or" specifies the presence of one or more of the associated entities.

The microphone assembly comprises a microphone with a first acoustic port, wherein the microphone is configured to convert acoustic waves received through the first acoustic port into an electric signal. The microphone assembly comprises a filter housing with a second acoustic port and a rim. The microphone assembly comprises a carrier attached to the microphone and to the rim of the filter housing such that the carrier and the filter housing together enclose a cavity with a first acoustic passage fluidly connecting the first acoustic port and the second acoustic port thereby enabling acoustic waves to propagate from the second acoustic port through the first acoustic passage to the first acoustic port. A port axis is defined as a straight line extending in the direction of acoustic flow through the first acoustic port and further extending through the geometric center of the first acoustic port. The direction of acoustic flow through a port should be understood as the main or mean direction in which acoustic waves travel through the port when in use.

The carrier and the filter housing are configured to cause the cavity to comprise an acoustic chamber and a second acoustic passage, wherein the second acoustic passage has a first opening into the first acoustic passage and a second opening into the acoustic chamber such that the acoustic chamber and the second acoustic passage together establish a Helmholtz resonator for suppressing acoustic energy within a first frequency band in acoustic waves propagating through the first acoustic passage.

The Helmholtz resonator is an acoustic filter, and one advantage of this configuration is that it enables efficient suppression of airborne acoustic waves within the first frequency band, e.g. at ultrasonic frequencies, before the airborne acoustic waves reach the first acoustic port of the microphone. This is in turn advantageous for effectively reducing the risk of saturation of the microphone, including its electronic circuitry. Also, it is advantageous in terms of reducing aliasing effects during A/D conversion.

In terms of effectiveness, the Helmholtz resonator enables significantly improved suppression of airborne acoustic waves within a first frequency band by e.g. 30-35 dB. The first frequency band may be an interval in the ultrasound frequency domain. In the present context, the ultrasound frequency domain covers frequencies above 10 kHz, and preferably above 20 kHz. In some examples, the Helmholtz resonator is configured such that maximum suppression is achieved in a narrow frequency band located in the broader range of 20-50 kHz, e.g. in the range of 30-40 kHz.

In addition, a wider ranging suppression by e.g. 10 dB or more may take place already at frequencies above 10 kHz, e.g. above 15 kHz, e.g. above 20 kHz. The wider ranging suppression may take place over a frequency decade or more.

The microphone assembly may be utilized in a device that picks up audible sound. The device may be worn by a human. In the present context, the audible sound should be understood to cover frequencies between 20 Hz and 20 kHz. The microphone assembly according to some embodiments is suitable for a listening device such as a hearing aid, a headset, an earbud, an active hearing protection device, or the like. The listening device may, in addition to audible sounds, pick up signals with higher frequencies. However, these frequencies should preferably be suppressed as they may disturb the user.

In some examples the filter housing has a diameter between about 4 and 8 mm and a height of about 1 mm, e.g. in the range of about 0.5 to 2 mm. In some examples the length of the second acoustic passage is about 0.4 to 0.6 mm. In some examples, the diameter of the second acoustic port is about 1.3 to 1.6 mm. These examples are non-limiting and are mainly given to indicate the possible small size of the Helmholtz resonator when configured for suppression of ultrasonic energy at a microphone sound inlet port.

In terms of efficiency, the Helmholtz resonator is a passive component that enables a compact and low profile microphone assembly that has a very low cost both in respect of cost of the components themselves and in respect of other production costs.

Another advantage is that an electronic low-pass filter, such as an antialiasing filter, e.g. embodied in the microphone, can be dispensed with or its filter order can be reduced. This enables reductions in power consumption, which is an important improvement not least for battery-operated devices including the microphone assembly.

Further advantages include that the filter housing can be manufactured and mounted with high precision, which in turn enables that the filter effect can be accurately tailored. In terms of manufacturing, the filter housing can be mounted automatically on an assembly line together with other components e.g. during a so-called reflow soldering process. In some examples several filter housings are attached to a so-called tape or reel for automatic montage by a machine. When the filter housing is soldered to the carrier, the soldering can easily establish an airtight sealing by means of the solder.

It is noted that the second acoustic passage is also denoted a 'neck', which is a term generally used in connection with the term 'chamber' when describing the configuration of a Helmholtz resonator. Generally, the neck allows passage of airborne acoustic waves between the first acoustic passage and the acoustic chamber. Generally, the first acoustic passage and the second acoustic passage meet in a junction portion. Generally, the second acoustic port is a 'free end' of the microphone assembly for receiving acoustic waves from the surrounding environment.

In some non-limiting examples the microphone comprises a substrate, such as e.g. a silicon substrate, with a microphone housing, covering a transducer element, such as a micro-electromechanical-system (MEMS), with a diaphragm, for converting acoustic waves to an electric signal, and optionally an electronic component, e.g. an application-specific integrated circuit (ASIC) arranged on the substrate. MEMS microphones are particularly prone to capturing and responding to acoustic waves at higher frequencies such as ultrasound frequencies due to their generally small size and ultra-light membranes. So, the above-mentioned problems and advantages may be especially articulated in connection with MEMS microphones. In other examples, the microphone is a condenser microphone, or an electret microphone, arranged in a microphone capsule.

In some examples, the carrier comprises one or more of: a substrate, a circuit board, such as e.g. a printed circuit board (PCB), and a microphone housing. For example, the first acoustic port may be formed by a gap or a hole in a substrate, a circuit board or a microphone housing, and/or a combination of the preceding. For example, a first acoustic passage may be formed at least partially by the filter housing, a substrate, a circuit board, a microphone housing, and/or a combination of the preceding.

The carrier may at least partially form the first acoustic port, e.g. in the form of a bore through the carrier. The first acoustic port may additionally be formed by other objects as well.

In some examples, the first acoustic port is an aperture or hole in a substrate, e.g. a silicon substrate, carrying the microphone. In some examples, the first acoustic port is an aperture or hole in a circuit board carrying the microphone. These examples include so-called bottom-port microphones.

In some other examples, the first acoustic port is an aperture or hole in a housing covering the microphone, also denoted a microphone housing. The microphone housing may also be denoted a lid. These examples include so-called top-port microphones.

In some examples the microphone housing is denoted a capsule.

Expediently, in some examples, the filter housing is configured as a metal or metalized SMD component e.g. for reflow soldering to a substrate, e.g. a circuit board, during manufacturing. Reflow soldering is a process in which a solder paste is used to temporarily attach components to the substrate at contact pads, after which controlled heat melts the solder paste and establishes electric connections. In some non-limiting examples, the filter housing is configured with a ring shape, in some aspects looking like a ring pan.

The microphone may comprise a transducer element for converting the received acoustic waves into the electric signal. The transducer element may be arranged on a first side of the carrier and the filter housing may be arranged at a second side, opposite the first side, of the carrier, such that the transducer element is fluidly connected to the second acoustic port through the first acoustic port and the first acoustic passage.

This configuration offers the advantage that the microphone can be of a conventional type, e.g. a so-called bottom-port type, and attached to e.g. a circuit board using conventional manufacturing methods. The microphone itself may comprise a carrier, which may be a substrate e.g.

carrying a microphone housing on a first side. The filter housing can be arranged at a second side of the substrate opposite to the first side. The filter housing effectively requires only a marginal additional space which is important in many devices, e.g. in listening devices such as hearing devices, using microphones are of very small size.

Thus, in some examples the carrier includes a substrate and/or a circuit board. In some examples, the carrier includes a stack of substrates.

In some examples, the microphone includes a microphone housing attached to a first side of the carrier; and the filter housing is attached to a second side, opposite the first side of the carrier.

The direction of acoustic flow through the second acoustic port may be parallel to the port axis. Alternatively, or additionally, the port axis may extend through the second acoustic port, preferably through the geometric center of the second acoustic port.

The carrier may have a bore enclosing at least a portion of the first acoustic passage, and a center axis of the bore may coincide with the port axis.

Thereby, the first acoustic passage may have the shape of a straight well leading directly to the microphone. This has the advantage that the microphone can capture acoustic waves from the surroundings with minimal interference from mechanical structures. This configuration is preferred with microphones that have bottom-port configuration and enables implementation of a compact, low profile microphone assembly.

The filter housing may comprise an inner portion with a central portion that has a depression formed by a central skirt extending towards the carrier and terminating in a flange surrounding the second acoustic port at a distance from the carrier.

An advantage thereof is that the filter housing can be manufactured at low cost e.g. by being press-formed from a disc, stamped out from a thin sheet of metal or press-formed from powder.

The flange and the carrier are at a distance from each other and form opposite sides of the second acoustic passage. The central skirt confines the acoustic chamber of the Helmholtz resonator towards the second acoustic passage. Thus, the second acoustic passage is thereby narrower than the acoustic chamber. In some examples the flange and the carrier are substantially parallel, at least in the region of the second acoustic passage.

The filter housing may comprise an inner portion surrounded by a circumferential skirt extending to the rim.

Thereby the inner portion or a portion thereof is raised away from the carrier and establishes the acoustic chamber between the carrier and the inner portion or a portion thereof. The acoustic chamber is outwardly confined by the circumferential skirt.

An advantage thereof is that the filter housing can be manufactured at low cost e.g. by being press-formed from a disc, stamped out from a thin sheet of metal or press-formed from powder.

The filter housing may be rotationally symmetric with respect to the port axis.

This may further facilitate attaching the filter housing to the carrier and may further provide a better acoustic response of the Helmholtz resonator.

The inner portion of the filter housing may have at least one debossed portion with a trough running from the circumferential skirt towards the second acoustic port and reaching the carrier at the trough such that in addition to the acoustic chamber and the second acoustic passage the cavity comprises a further acoustic chamber and a further acoustic passage. The further acoustic passage may have a first opening into the first acoustic passage and a second opening into the further acoustic chamber such that the further acoustic chamber and the further acoustic passage together establish a further Helmholtz resonator for suppressing acoustic energy within a second frequency band, different from the first frequency band, in acoustic waves propagating through the first acoustic passage.

An advantage thereof is that the filter housing can be manufactured at low cost e.g. from a sheet member and accommodate two differently configured Helmholtz resonators. It is thereby possible to suppress a wider band of frequencies or multiple bands of frequencies. The filter housing may accommodate additional chambers and respective neck portions by including additional debossed portions.

In some examples, the inner portion of the filter housing has a debossed portion that reaches the support face within one or more first angle ranges with respect to the port axis, while the debossed portion terminates at a distance from the carrier within the remaining angle ranges. This may restrict the angular extension of the second acoustic passage to the remaining angle ranges, such that different neck dimensions can easily be achieved while the filter housing can be manufactured at low cost.

The filter housing may be a shaped piece of metal, and the rim may be attached to the carrier by a solder material or glue.

In some examples the shaped piece of metal is punched out from a sheet of metal. In other aspects the filter housing is made from silicon, ceramics or a plastics material which is glued to the carrier. In some examples the filter housing is metalized and attached to a carrier by a solder material.

The microphone assembly may further comprise an air-permeable filter member dampening acoustic energy at least at a frequency below the resonant frequency of the Helmholtz resonator, and the air-permeable filter member may be arranged inside or at the first acoustic port.

An advantage thereof is that the effects of undesired resonances between components of the Helmholtz resonator and other acoustic components of the microphone assembly may be mitigated, e.g. to achieve a flatter frequency response. For instance, undesired peaks in the frequency-gain characteristics of the microphone may be suppressed by the air-permeable filter member. The air-permeable filter member may have a mesh-type or sponge-type structure. The air-permeable filter member may additionally serve as a protective member to prevent dust and small particles from reaching the microphone.

The carrier may comprise a substrate, such as a silicon substrate, and/or a circuit board.

An advantage thereof is that that microphone assembly can include a conventional microphone phone e.g. a microphone, such as a MEMS microphone, mounted on a substrate, such as a silicon substrate, and having a bottom-port configuration. Still, the microphone assembly can have a very compact configuration close to a circuit board.

The substrate may be a single crystal silicon substrate. A circuit board, e.g. printed circuit board (PCB) may mechanically support and electrically connect electronic components using conductive tracks, pads and other features etched from one or more sheet layers of copper laminated onto and/or between sheet layers of a non-conductive substrate. Components are generally soldered onto the PCB to both electrically connect and mechanically fasten them to it.

The carrier may have a recess or bore, and the recess or bore may completely or partially accommodate the filter housing.

Thereby, the profile height of the microphone assembly can be further lowered since at least a portion of the cavity can be accommodated in the recess or in the bore. In some examples the carrier may comprise a circuit board such as a layered circuit board with conductive circuit paths or conductive layers.

In some examples of embodiments, wherein a circuit board includes the bore completely or partially accommodating the filter housing, the microphone is mounted on a first side of a substrate and the filter housing is attached to the second side, opposite the first side, of the substrate.

In some examples of embodiments, wherein the circuit board includes the recess completely or partially accommodating the filter housing, the microphone is mounted on a first side of the substrate and the filter housing is attached to the second side, opposite the first side, of the substrate in the recess of the circuit board. The recess is thus made in the carrier at the opposite side of the microphone. A recess is distinguished from a bore in that a recess does not extend all the way through the carrier.

In some examples the filter housing is attached to the circuit board at the bottom of the recess or attached to the circuit board at a rim portion thereof surrounding the recess.

In some examples, the microphone assembly may comprise a substrate with an overhang portion with respect to the filter housing, and the microphone may be configured with metal pads at the overhang portion.

Thereby the microphone assembly can have a low-profile height that enables tight integration and small size. An advantage is that the microphone can be attached to a circuit board at the overhang portion. The filter housing may be attached for example, by glue, solder, fastening means such as screws, rivets, or a combination of the preceding. Also, this configuration is useful when the microphone or rather a microphone housing has a cross-section ('footprint') greater than the filter housing.

In some examples the circuit board has a bore or a recess with a cross-section sufficiently wide to accommodate the cross-section of the filter housing. Here, the filter housing may be attached at a bottom portion of the recess, for example, by glue, solder, fastening means, or a combination of the preceding. In some examples the overhang portion has a disc shape, a rectangular shape or includes multiple noses. Here, the filter housing may be attached at the overhang of the substrate, for example, by glue, solder, fastening means, or a combination of the preceding.

In some other aspects, the microphone assembly includes a substrate with an overhang portion with respect to the microphone or rather a microphone housing, and the microphone is configured with metal pads at the overhang portion. An advantage is that the microphone can be attached to a circuit board at the overhang portion. Also, this configuration is useful when the filter housing has a cross-section greater than the microphone or rather a microphone housing. The filter housing may be attached at the overhang, for example, by glue, solder, fastening means, or a combination of the preceding. In this aspect, in some examples, the circuit board has a bore or a recess with a cross-section sufficiently wide to accommodate the cross-section of the microphone or rather the microphone housing. In this aspect, the metal pads, at the overhang portion, extends from the microphone to the overhang portion as elongated pads e.g. via one or more 'vias' or bonding wires.

The carrier may comprise a substrate and/or a microphone housing.

This enables configuring a bottom-port microphone or a top-port microphone with a Helmholtz resonator.

The microphone may comprise a substrate and a microphone housing with a top portion surrounded by peripheral skirt extending downwards to the substrate. The first acoustic port may extend through the top portion. The microphone housing may be attached to a first side of the substrate. The carrier may comprise the microphone housing. The filter housing may be arranged at the first side of the substrate on or around the microphone housing.

Thereby a so-called top-port microphone is configured with the Helmholtz resonator. In some examples the filter housing is attached at the top portion. In some examples the filter housing is attached at the downwardly extending skirt. In some examples the filter housing is attached to the substrate of the microphone and circumscribes the microphone housing.

A listening device may comprise at least one microphone assembly described herein.

Exemplified listening devices includes hearing aids, hearing protectors, headsets, earphones, and headphones with one or more microphones.

BRIEF DESCRIPTION OF THE DRAWINGS

The embodiments will be explained in more detail below with reference to the drawings in which.

Figure 1:
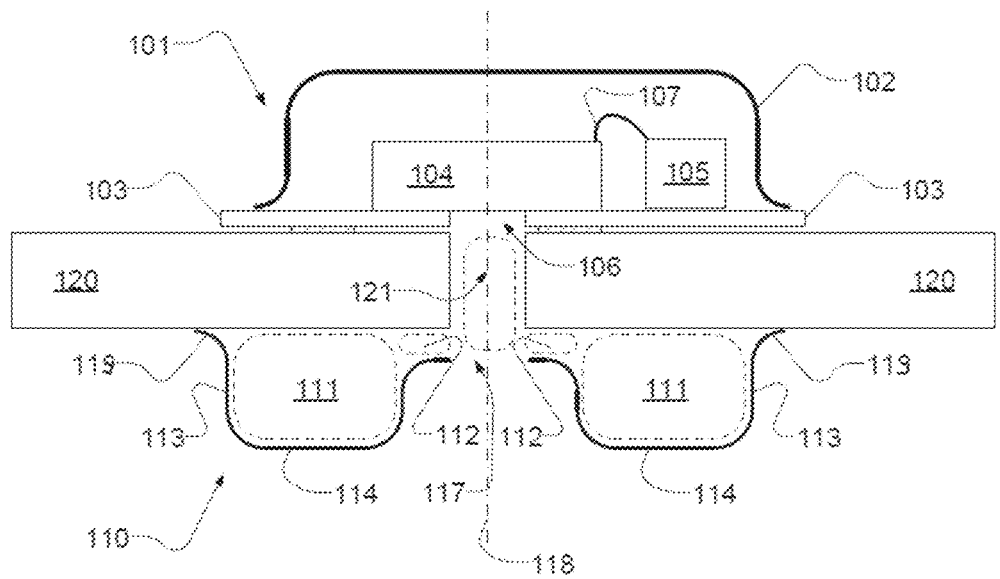
FIG. 1 shows a cross-sectional view of a microphone assembly including a filter housing and a microphone arranged at opposite sides of a circuit board.

Generally, herein the term 'up' and 'down' and 'upper' and 'lower' refer to the orientation depicted in the drawing sheets. However, this is used for describing relative geometric relations more conveniently and should not limit the scope of the claims since these terms do not refer to the orientation of the elements described when used e.g. in listening devices.

DETAILED DESCRIPTION

Various exemplary embodiments and details are described hereinafter, with reference to the figures when relevant. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

FIG. 1 shows a cross-sectional view of a microphone assembly including a filter housing 110 and a microphone 101 arranged at opposite sides of a carrier constituted by a circuit board 120.

The microphone 101 has a first acoustic port 106, which in this embodiment is arranged in a substrate 103, such as a silicon substrate. Substrate 103 carries electronic components of the microphone on one side and is attached to the circuit board 120 at the other side. This is a so-called bottom-port type of microphone. The filter housing 110 is attached to the opposite side of the circuit board 120 and has a second acoustic port 117. The first acoustic port 106 and the second acoustic port 117 are embodied as holes in the substrate 103 and the filter housing 110, respectively. A bore through the circuit board 120 establishes a portion of a first acoustic passage 121 fluidly connecting the first acoustic port 106 and the second acoustic port 117. The filter housing 110 is substantially rotationally symmetric about a port axis 118, which is defined as a straight line extending in the direction of acoustic flow through the first acoustic port 106 and further extending through the geometric center of the first acoustic port 106.

Thus, the microphone 101 is arranged at a first side of a carrier formed by the circuit board 120, and the filter housing 110 is arranged at a second side, opposite the first side, of the carrier.

Generally, the microphone 101 is configured to convert acoustic waves received through the first acoustic port 106 into an electric signal. In the microphone assembly shown, acoustic waves enter the first acoustic passage 121 from the environment through the second acoustic port 117. The microphone 101 comprises a transducer element 104 which is attached, e.g. via bonding wires 107 to an electronic circuit 105. The electronic circuit 105 may include an amplifier, e.g. a pre-amplifier, and e.g. an analogue-to-digital (A/D) converter. Accordingly, the electric signal may be an analogue signal or a digital signal.

The filter housing 110 has a rim 119 that is attached to the circuit board 120 such that the filter housing 110 and the circuit board 120 together enclose a cavity comprising the first acoustic passage 121 as well as an acoustic chamber 111 and a second acoustic passage 112. The second acoustic passage 112 has a first opening into the first acoustic passage 121 and a second opening into the acoustic chamber 111. The first opening allows the passage of acoustic waves between the first acoustic passage 121 and the second acoustic passage 112. The second opening allows the passage of acoustic waves between the second acoustic passage 112 and the acoustic chamber 111. The acoustic chamber 111 and the second acoustic passage 112 form in unison a respective chamber and neck of a Helmholtz resonator for suppressing acoustic energy within a first frequency band in acoustic waves propagating through the first acoustic passage 121, in particular from the second acoustic port 117 towards the first acoustic port 106 of the microphone.

The acoustic chamber 111 and the second acoustic passage 112 are thus confined by the filter housing 110 and the circuit board 120. It can also be seen that the second acoustic passage 112 is narrower than the acoustic chamber 111 such that a Helmholtz resonator is formed. At the resonant frequency of the Helmholtz resonator and at adjacent frequencies, excessive movement of air through the neck 112 as well as excessive compression and decompression of air within the acoustic chamber 111 causes acoustic energy to dissipate as thermal energy, such that a portion of the acoustic energy entering the neck 112 is removed, thereby suppressing acoustic energy in acoustic waves propagating through the first acoustic passage 121.

The resonant frequency of a Helmholtz resonator is given by the below well-known expression:

$$f = \frac{c}{2\pi}\sqrt{\frac{A}{V \cdot l}}$$

wherein f [Hz] is the resonant frequency, c [m/s] is the speed of sound in air, l [m] is the length of the neck of the resonator, A [m$^2$] is the cross-sectional area of the neck and V [m$^3$] is the volume of the chamber. With reference to FIG. 1, the length of the neck equals the horizontal extension (orthogonal to the port axis 118) of the second acoustic passage 112 approximately indicated by the dashed box 112. The cross-sectional area of the neck equals the average cross-sectional area of the second acoustic passage 112 seen radially from the port axis 118, which may be approximated by a value somewhere between the cross-sectional area of the first opening (into the first acoustic passage 121) of the second acoustic passage 112 and the cross-sectional area of the second opening (into the acoustic chamber 111) of the second acoustic passage 112. The cross-sectional area of the neck may thus be computed from the radially inner diameter of the second acoustic passage 112, the radially outer diameter of the second acoustic passage 112, and the height (parallel to the port axis 118) of the second acoustic passage 112. The height equals the distance between the filter housing 110 and the circuit board 120 at the neck portion 112. The volume of the acoustic chamber 111 can be computed by considering the dashed box at reference numeral 111 as a rotationally symmetric volume. As can be seen the acoustic chamber 111 is established between a main portion 114 of the filter housing 110 and the circuit board 120. At its periphery, the acoustic chamber 111 is confined by a circumferential skirt 113 of the filter housing 110. Centrally, the acoustic chamber 111 narrows into the second acoustic passage 112.

Figure 2:
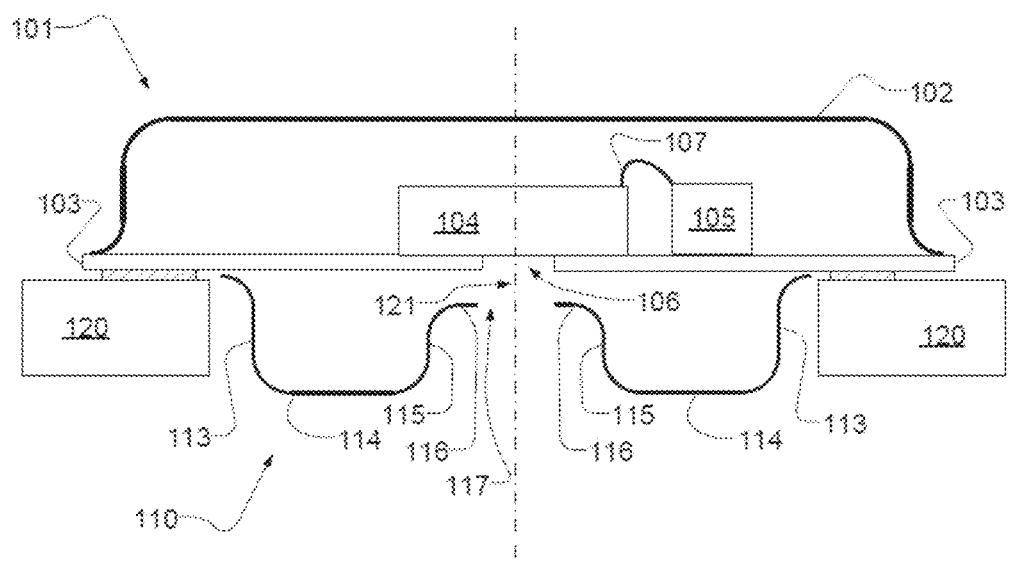
FIG. 2 shows a cross-sectional view of a microphone assembly including a filter housing attached to a microphone.

FIG. 2 shows a cross-sectional view of a microphone assembly including a filter housing 110 with a rim 119 attached to a carrier constituted by a substrate 103 of a microphone 101. Also in this view, the filter housing 110 is substantially rotationally symmetric about the port axis 118.

In this embodiment the circuit board 120 has a bore; wherein the bore at least partially accommodates the filter housing 110. Thus, the bore forms a 'well' with a sufficiently wide cross-section, e.g. substantially circular or rectangular, that the filter housing can be lowered into and be at least partially accommodated in the bore. The main portion 114 of the filter housing may be at a flush level with the lower surface of the circuit board 120 or it may be lower or higher.

As can be seen, the microphone 101 and in particular its substrate 103 has an overhang portion with respect to the filter housing 110. This may be useful if the microphone 101 generally has a wider footprint compared to the filter housing 110. To establish electric connection between the microphone 101 and the circuit board 120, the microphone 101 may be configured with metal pads at the overhang portion. That is, metal pads are arranged at the underside of the overhang and corresponding metal pads are arranged accordingly on the upper side of the circuit board 120.

Albeit closely resembling the filter housing shown in FIG. 1, there is left more space in FIG. 2 for reference numerals referring in more detail to the shape of the filter housing 110, in particular its central portion. The central portion has a depression formed by a central skirt 115 extending from the main portion 114 towards the substrate 103 and terminating in a flange 116 surrounding the second acoustic port 117 at a distance from the substrate 103. Thus, the flange 116 and the substrate 103 are at a distance from each other and form opposite sides of the second acoustic passage 112 (see FIG. 1). The central skirt 115 centrally confines the acoustic chamber 111 (see FIG. 1) of the Helmholtz resonator and narrows the second acoustic passage 112 relative to the acoustic chamber 111. The second acoustic passage 112 is thus formed in the space defined between the flange 116 and the substrate 103. As in FIG. 1, the second acoustic passage 112 has a first opening into the first acoustic passage 121 and a second opening into the acoustic chamber 111. In some examples, the flange 116 or at least a portion of the flange 116 and the substrate 103 are substantially parallel.

In some examples, not shown, the filter housing 110 may be an integral portion of the circuit board 120. In such examples, the filter housing 110 may be manufactured by forming a recess in the upper surface of the circuit board 120 with a diameter similar to the diameter of the bore shown in FIG. 2 and letting the bottom of the recess extend radially inwards to a central bore constituting the second acoustic port 117. The circuit board 120 may thus equal a vertically flipped version of the circuit board 120 shown in FIG. 3. The depth of the radially inner portion of the recess may be less than the depth of the radially outer portion of the recess, such that the recess contributes to the narrowing of the second acoustic passage 112. Additionally, or alternatively, the radially inner portion of the recess may be met by a corresponding raised portion of the substrate 103. For instance, the raised part of the substrate 103 may be a hollow cylinder with a wall thickness corresponding to the length of the second acoustic passage 112. In other words, the shape of any one, or both, of the carrier 103 and the filter housing 110 may be adapted to define the properties of the Helmholtz resonator 111, 112 to achieve a desired resonant frequency, a desired bandwidth of the resonance, and/or desired physical dimensions of the microphone assembly.

Figure 3:
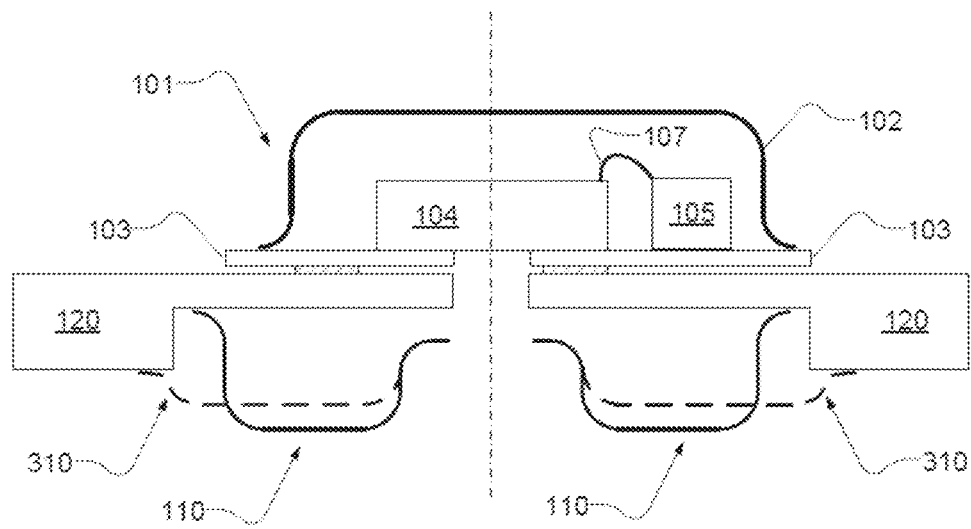
FIG. 3 shows a cross-sectional view of a microphone assembly including a filter housing arranged in a depression in a circuit board and a microphone arranged opposite the filter housing.

FIG. 3 shows a cross-sectional view of a microphone assembly including a filter housing 110 arranged in a depression in a carrier constituted by a circuit board 120 and further including a microphone 101 arranged opposite the filter housing 110. In this embodiment, the circuit board 120 has a recess that at least partially accommodates the filter housing 110. Thus, the recess forms a 'well' with a sufficiently wide cross-section e.g. substantially circular or rectangular, that the filter housing 110 can be inserted into and be at least partially accommodated in the recess. The rim 119 of the filter housing 110 is attached to the circuit board 120 within the recess. In some examples, the rim 119 of the filter housing 110 is attached at a bottom portion of the recess. In some examples, the rim 119 of the filter housing 110 is attached at a side portion and/or wall portion of the recess. The main portion 114 of the filter housing may be at a flush level with the lower surface of the circuit board 120 or it may be lower or higher.

In some examples the filter housing, here designated 310 and illustrated by dashed lines, may be flatter. In such examples, the rim 119 of the filter housing 310 may instead be attached to the circuit board 120 at a periphery of the recess, e.g. outside the recess. Thus, filter housing 310 is an alternative to filter housing 110. Filter housing 310 may have the advantage of even better utilizing available space and allowing compact integration.

In some examples, not shown, the filter housing does not have a circumferential skirt 113 but rather has a flat or disk-like shape. A rim 119 of the filter housing is attached to the circuit board 120 at a periphery of the recess, outside the recess in a manner similar to the alternative filter housing 310.

In some examples, not shown, the central skirt 115 of the filter housing 110, 310 is lower or replaced with a flat portion, and the recess of the circuit board 120 is ring-shaped such that the depth of the radially inner portion of the recess is less than the depth of the radially outer portion of the recess—or even negative, such that the recess contributes to the narrowing of the second acoustic passage 112. The second acoustic passage 112 may further be bounded by a combination of an extruding part and the inner depression 115 of the filter housing 110, 310. In other words, the shape of any one, or both, of the carrier 120 and the filter housing 110, 310 may be adapted to define the properties of the Helmholtz resonator 111, 112 to achieve a desired resonant frequency, a desired bandwidth of the resonance, and/or desired physical dimensions of the microphone assembly.

Also in this example, the second acoustic passage 112 has a first opening into the first acoustic passage 121 and a second opening into the acoustic chamber 111. In such examples, the position of the first opening of the second acoustic passage 112 can be arranged at varying distances from the microphone 101.

Figure 4:
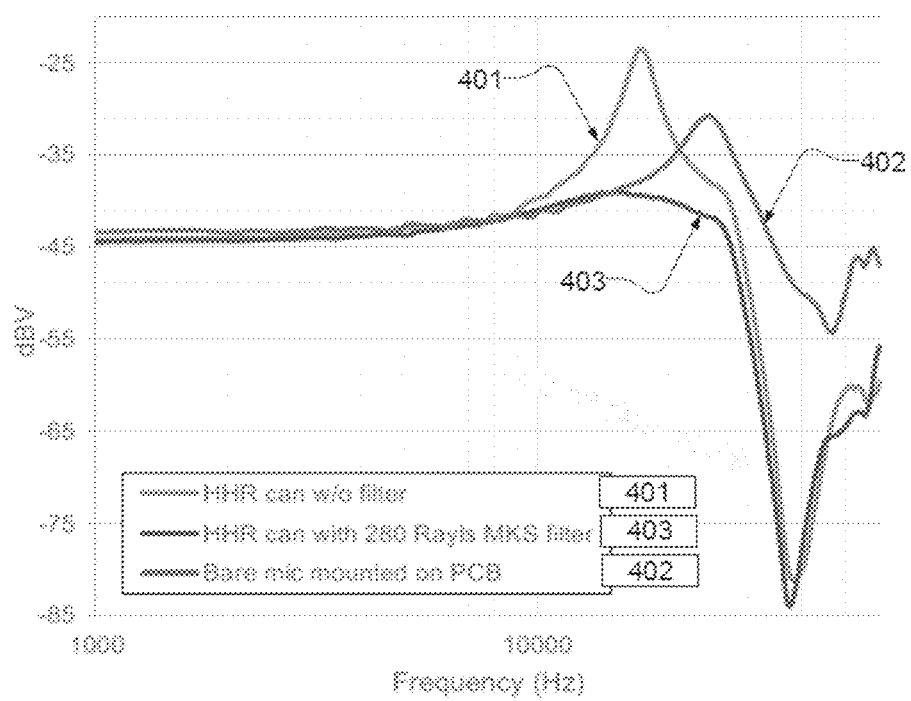
FIG. 4 shows examples of frequency-gain characteristics of a microphone included in microphone assembly in different configurations including one with a Helmholtz resonator.

FIG. 4 shows examples of frequency-gain characteristics of a microphone 101 included in a microphone assembly in different configurations including one with a carrier 103, 120 and a filter housing 110, 310 establishing a Helmholtz resonator 111, 112.

For comparison, the characteristic 402 is for a microphone 101 included in a microphone assembly, however without a Helmholtz resonator 111, 112. As can be seen the characteristic 402 exhibits a peak between 20 and 30 kHz and a corresponding dip at just below 50 kHz. The dip, in this example about −10 dB relative to the gain at 1 kHz, is however not sufficient to reduce the undesired effects from strong ultrasound signals such as those from ultrasonic distance sensors.

The frequency-gain characteristic 401 represents a microphone 101 included in a microphone assembly including a carrier 103, 120 and a filter housing 110, 310 establishing a Helmholtz resonator 111, 112. This characteristic exhibits a dip at just below 40 kHz, in this example with a magnitude of about −35 dB relative to the gain at 1 kHz, which is typically sufficient to significantly reduce the undesired effects from strong ultrasound signals. The dip is located at the resonant frequency of the Helmholtz resonator 111, 112. As can be seen the lowering of the gain relative to the characteristic 402 extends from the dip into higher frequencies; for instance, at 40 kHz the gain is about 20 dB lower than at 1 kHz. Unfortunately, the characteristic 401 also exhibits a peak at just below 20 kHz of about +20 dB. This peak is caused mainly by interaction between components of the Helmholtz resonator 111, 112 and other acoustic components of the microphone assembly. The peak may not be a problem, at least since strong signals e.g. from the mentioned assist systems are not always present in this frequency range.

However, an improvement is illustrated by the frequency-gain characteristic 403, which represents a microphone 101 included in a microphone assembly including a carrier 103, 120 and a filter housing 110, 310 establishing a Helmholtz resonator 111, 112 and further with the addition of an air-permeable filter member dampening acoustic energy at a frequency below the resonant frequency of the Helmholtz resonator 111, 112. The air-permeable filter member is preferably arranged in or at the first acoustic port 106 (see e.g. FIG. 1), e.g. at a lower or an upper surface of the substrate 103, or at other locations between the second acoustic passage 112 and the first acoustic port 106, such as e.g. in or at the bore in the circuit board 120. Thereby, as frequency-gain characteristic 403 exhibits, the peak is significantly dampened. In this example the peak is dampened by about 15 dB with respect to the frequency-gain characteristic 401. Thereby, the microphone assembly achieves significant suppression of ultrasonic signals, while substantially avoiding the excessive peak below the resonant frequency of the Helmholtz resonator 111, 112. An advantage is thus a flatter frequency response below 20-30 kHz, and a significant suppression at frequencies in the ultrasonic range. By adapting the shape of any one, or both, of the carrier 103 and the filter housing 110, the properties of the Helmholtz resonator 111, 112 can be changed to thereby achieve a desired resonant frequency, a desired bandwidth of the resonance, and/or desired physical dimensions of the microphone assembly. Additionally, by manipulating the dimensions of the resonator, e.g. dimensions of the second acoustic passage and/or the acoustic chamber, the resonant frequency of the resonator can be tuned such that acoustic waves with different frequencies can be suppressed. In other words, the Helmholtz resonator can be design to suppress acoustic energy in any frequency band within the ultrasound frequency domain.

In some embodiments, the air-permeable filter member has an airflow resistance of about 280 $Rayl_{MKS}$ or an airflow resistance in the range from 100 to 500 $Rayl_{MKS}$. This has the advantage of dampening a resonance peak that may occur below the resonant frequency of a Helmholtz resonator dimensioned for suppression of ultrasonic frequencies.

The legend in the figure refers to "HHR can w/o filter", which refers to characteristic 401 and is shorthand for the microphone assembly including the Helmholtz resonator 111, 112. The legend also refers to "HHR can with 280 Rayls MKS filter", which refers to characteristic 403 and is shorthand for the microphone assembly including the Helmholtz resonator 111, 112 and the air-permeable filter member described above. Finally, the legend refers to "Bare mic mounted on PCB", which refers to characteristic 402 and is shorthand for a microphone 101 mounted on a circuit board 120 and not including the Helmholtz resonator.

Figure 5:
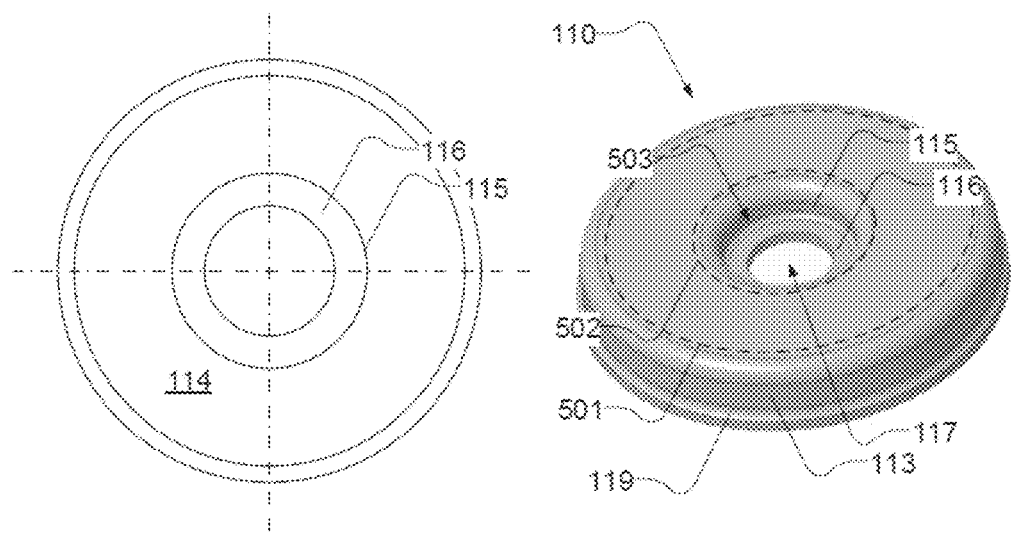
FIG. 5 shows a topographic view and a 3D view of an embodiment of a single-chamber rotationally symmetrical filter housing.

FIG. 5 shows a topographic view and a 3D view of a single-chamber rotationally symmetrical filter housing 110. Here it is also shown that the central portion, here designated 502 has a depression formed by the central skirt 115 extending from the main portion 114 towards the carrier 103, 120 (not shown here) and terminating in a flange 116 surrounding the second acoustic port 117 at a distance from the carrier 103, 120. Thus, the flange 116 and the carrier 103, 120 are at a distance from each other and form the second acoustic passage 112 (see FIGS. 1 and 2). The central skirt 115 confines the acoustic chamber 111 (see FIG. 1) of the Helmholtz resonator centrally and narrows the second acoustic passage 112 relative to the acoustic chamber 111. The second acoustic passage 112 is thus formed in the space defined between the flange 116 and the carrier 103, 120. Also, the peripheral skirt 113 extending from the main portion 114 to and terminating at a rim 119 can be seen. The filter housing can be attached to the carrier 103, 120 at the rim 119.

Figure 6:
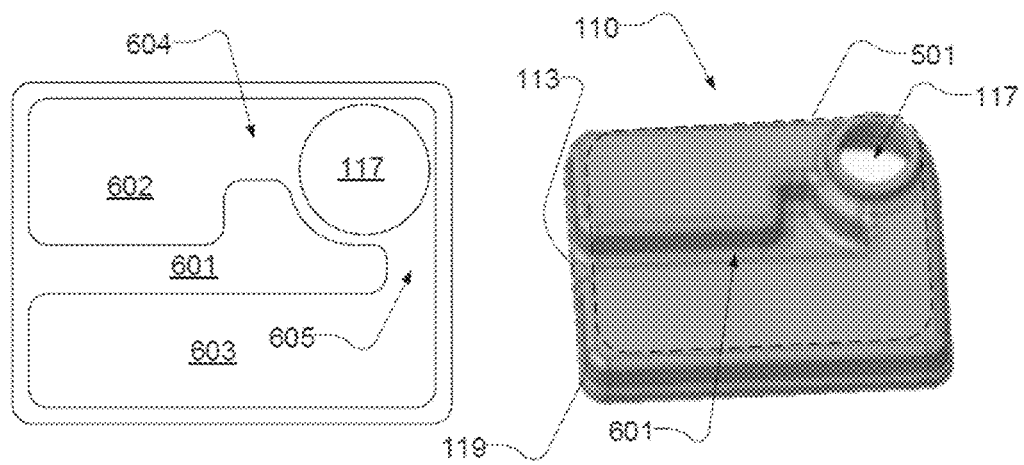
FIG. 6 shows a topographic view and a 3D view of an embodiment of a dual-chamber filter housing.

FIG. 6 shows a topographic view and a perspective view of a dual-chamber filter housing 110. The embodiment shown here differs from the previously described embodiments by including an additional Helmholtz resonator with an additional chamber and a corresponding additional neck portion.

Thus, with respect to the left-hand side of FIG. 6, a first Helmholtz resonator is formed by a first acoustic chamber 602 and a first neck portion or acoustic passage 604. A second Helmholtz resonator is formed by a second acoustic chamber 603 and a second neck portion or acoustic passage 605. The first Helmholtz resonator and the second Helmholtz resonator are each in fluid connection with the second acoustic port 117. The first and second acoustic chambers 602 and 603 are separated by a debossed portion 601, which can be seen also in the perspective view on the right-hand side of FIG. 6.

Also, here it can be seen that the filter housing 110 has an inner portion 501 surrounded by the circumferential skirt 113 extending to the rim 119 at which the filter housing can be attached to a carrier 103, 120. The inner portion 501, or rather—in this embodiment—a portion thereof, is raised away from the carrier 103, 120 and establish the first and second acoustic chambers 602, 603 between the carrier 103, 120 and the inner portion 501. The first and second acoustic chambers 602, 603 are peripherally confined by the circumferential skirt 113.

In this embodiment in particular, the inner portion 501 of the filter housing 110 has a debossed portion 601 with a trough running from the circumferential skirt 113 towards the second acoustic port 117 and reaching the carrier 103, 120 at the trough to thereby establish a divider wall between the first acoustic chamber 602 and the second acoustic chamber 603. Further, the debossed portion 601 confines the first and second acoustic passages 604 and 605, respectively between the first acoustic chamber 602 and the second acoustic port 117 and the second acoustic chamber 603 and the second acoustic port 117, such that the first acoustic passage 604 is narrower than the first acoustic chamber 602 and the second acoustic passage 605 is narrower than the second acoustic chamber 603. Thereby, an additional Helmholtz resonator is implemented. In a similar manner, further Helmholtz resonators can be implemented.

Figure 7:
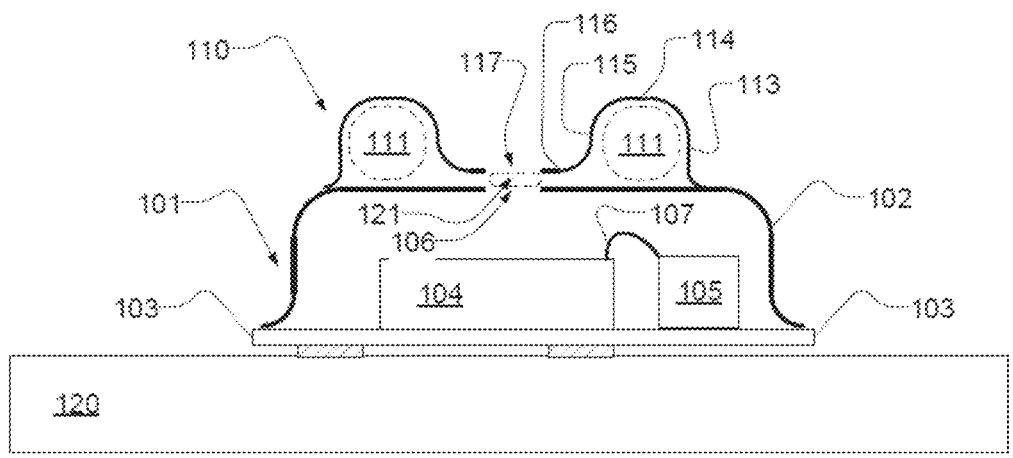
FIG. 7 shows a cross-sectional view of a microphone assembly including a filter housing atop a microphone housing.

FIG. 7 shows a cross-sectional view of a microphone assembly including a filter housing 110 atop a microphone housing 102. In this embodiment, the microphone 101 includes a microphone housing 102 with a top portion surrounded by a downwardly extending peripheral skirt. The first acoustic port 106 extends through the top portion and the microphone 101 is thus a so-called top-port microphone. The microphone housing 102 is attached to a first side of the substrate 103, e.g. a substrate. The filter housing 110 is arranged atop the microphone housing 102, and the rim 119 of the filter housing 110 is attached to the top portion such that it surrounds first acoustic port 106. In this example, the carrier is constituted by the microphone housing 102 that together with the filter housing 110 enclose the cavity that comprises the Helmholtz resonator 111, 112 and the first acoustic passage 121.

In some examples, the rim 119 of the filter housing 110 is attached to the downwardly extending peripheral skirt of the microphone housing 102 e.g. at a side wall of the microphone housing 102.

Figure 8:
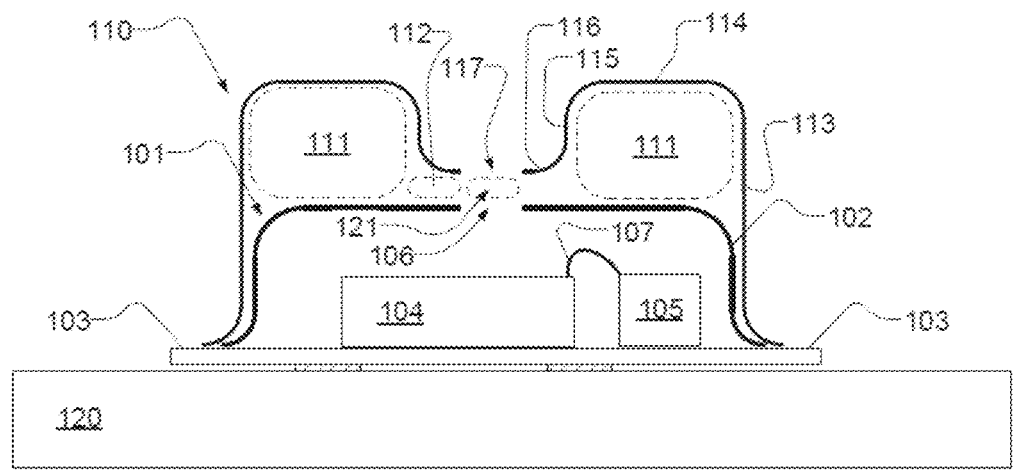
FIG. 8 shows a cross-sectional view of a microphone assembly including a filter housing enclosing a microphone housing.

FIG. 8 shows a cross-sectional view of a microphone assembly including a filter housing 110 enclosing a microphone housing 102. Also, in this embodiment the microphone 101 includes a microphone housing 102 with a top portion surrounded by a downwardly extending peripheral skirt. The first acoustic port 106 extends through the top portion and the microphone 101 is thus a so-called top-port microphone. The microphone housing 102 is attached to a first side of the substrate 103, e.g. a silicon substrate. The filter housing 110 is arranged over the microphone housing 102, and the rim 119 of the filter housing 110 is attached to the first side of the substrate 103. In this example, the carrier is constituted by the substrate 103 and the microphone housing 102 that together with the filter housing 110 enclose the cavity that comprises the Helmholtz resonator 111, 112 and the first acoustic passage 121.

Generally, two or more acoustic filters with Helmholtz resonators as described above may be stacked, such that acoustic waves from the environment travels through several first acoustic passages 121 extends, each with their own individually tuned Helmholtz resonator(s). In some examples, the rim 119 of a further filter housing 110 may be attached to the main portion of another filter housing 110. In some examples, the rim 119 of a further filter housing 110 may be attached to a silicon substrate 103 or a circuit board 120 thereby enclosing another filter housing 110.

Generally, herein, one or both of the filter housing 110 and the microphone housing 102 may have a substantially round or substantially rectangular cross-sectional shape or any other shape that serves the purpose of at least partly enclosing the cavity that comprises the Helmholtz resonator 111, 112.

Figure 9:
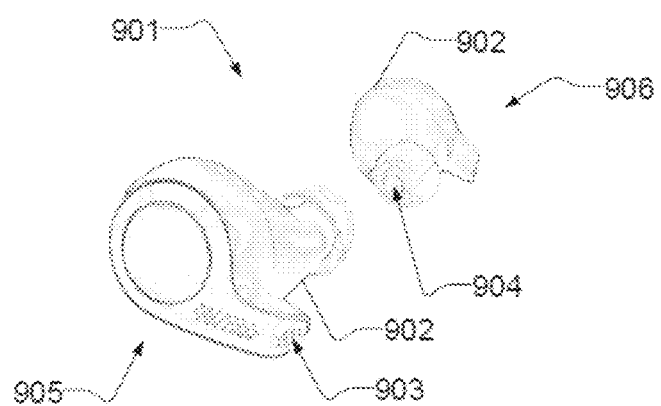
FIG. 9 shows a 3D view of an exemplified listening device.

FIG. 9 shows an example of a pair of listening devices comprising a right-ear device 905 and a left-ear device 906. The listening devices 905, 906 have a substantially similar, albeit mirrored shape each with a body 902. Each of the listening devices may have one, two or more microphone assemblies as described herein. To receive acoustic waves from the surroundings, each of the listening devices has one or more small holes 903 allowing passage of acoustic waves from the environment to the respective second acoustic ports 117 of the comprised microphone assemblies.

In some examples, listening devices comprising a microphone assembly as described herein are configured to one or more of: compensating for a hearing loss, protecting against loud sound levels in the surroundings, playing back audio signals, and/or operating as a headset for telecommunication.

At least in examples wherein the listening device is configured to compensate for a hearing loss, the listening device may be of e.g. a so-called Receiver-in-Ear (RIE) type, Behind the Ear (BTE) type, Completely-in-Canal (CIC) type or of another type known in the art of hearing devices including hearing aids. For other uses, the listening device may be of e.g. a so-called earbud type, an on-the-ear earphone type, or an over-the-ear earphone type. Furthermore, the listening device may be configured as a monaural listening device or as a binaural listening device.

Although features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications, and equivalents.

The invention claimed is:

1. A microphone assembly comprising:
 a microphone with a first acoustic port, wherein the microphone is configured to convert acoustic waves received through the first acoustic port into an electric signal;
 a filter housing with a second acoustic port; and
 a carrier coupled to the microphone and to the filter housing, wherein the carrier and the filter housing together enclose a cavity with a first acoustic passage fluidly connecting the first acoustic port and the second acoustic port, thereby enabling the acoustic waves to propagate from the second acoustic port through the first acoustic passage to the first acoustic port;
 wherein the cavity comprises an acoustic chamber and a second acoustic passage;
 wherein the second acoustic passage is in fluid communication with the first acoustic passage and with the acoustic chamber, and wherein the acoustic chamber and the second acoustic passage together establish a Helmholtz resonator for suppressing acoustic energy within a first frequency band in the acoustic waves propagating through the first acoustic passage, wherein the first frequency band is in an ultrasound frequency domain; and
 wherein the acoustic chamber has a depth measured in a direction that is perpendicular to the carrier, the depth of the acoustic chamber being larger than a wall thickness of a peripheral portion of the filter housing.

2. The microphone assembly according to claim 1, wherein the microphone comprises a transducer element for converting the received acoustic waves into the electric signal, and wherein the transducer element is coupled to a first side of the carrier and the filter housing is coupled to a second side of the carrier, the second side of the carrier being opposite from the first side of the carrier.

3. The microphone assembly according to claim 2, wherein the transducer element is in fluid communication with the second acoustic port through the first acoustic port and the first acoustic passage.

4. The microphone assembly according to claim 1, comprising a port axis, wherein the port axis is defined as a straight line extending in a direction of acoustic flow through the first acoustic port.

5. The microphone assembly according to claim 4, wherein the port axis extends through the second acoustic port.

6. The microphone assembly according to claim 4, wherein the port axis is parallel to a direction of acoustic flow through the second acoustic port.

7. The microphone assembly according to claim 4, wherein the carrier has a bore enclosing at least a portion of the first acoustic passage, and wherein a center axis of the bore coincides and/or is parallel with the port axis.

8. The microphone assembly according to claim 4, wherein the filter housing is rotationally symmetric with respect to the port axis.

9. The microphone assembly according to claim 1, wherein a central portion of the filter housing has a depression formed by a central skirt extending towards the carrier and terminating in a flange surrounding the second acoustic port at a distance from the carrier.

10. The microphone assembly according to claim 1, wherein a central portion of the filter housing is surrounded by a circumferential skirt of the peripheral portion.

11. The microphone assembly according to claim 1, wherein a central portion of the filter housing has a trough extending towards the second acoustic port.

12. The microphone assembly according to claim 1, wherein the cavity comprises an additional acoustic chamber and an additional acoustic passage, wherein the additional acoustic passage is in fluid communication with the first acoustic passage and with the additional acoustic chamber, and wherein the additional acoustic chamber and the additional acoustic passage together establish an additional Helmholtz resonator for suppressing acoustic energy within a second frequency band in the acoustic waves propagating through the first acoustic passage.

13. The microphone assembly according to claim 12, wherein the second frequency band is different from the first frequency band.

14. The microphone assembly according to claim 1, wherein the filter housing is a shaped piece of metal, and wherein a rim of the filter housing is attached to the carrier by a solder material or glue.

15. The microphone assembly according to claim 1, further comprising an air-permeable filter member inside or at the first acoustic port.

16. A microphone assembly comprising:
a microphone with a first acoustic port, wherein the microphone is configured to convert acoustic waves received through the first acoustic port into an electric signal;
a filter housing with a second acoustic port; and
a carrier coupled to the microphone and to the filter housing, wherein the carrier and the filter housing together enclose a cavity with a first acoustic passage fluidly connecting the first acoustic port and the second acoustic port, thereby enabling the acoustic waves to propagate from the second acoustic port through the first acoustic passage to the first acoustic port;
wherein the cavity comprises an acoustic chamber and a second acoustic passage;
wherein the second acoustic passage is in fluid communication with the first acoustic passage and with the acoustic chamber, and wherein the acoustic chamber and the second acoustic passage together establish a Helmholtz resonator for suppressing acoustic energy within a first frequency band in the acoustic waves propagating through the first acoustic passage, wherein the first frequency band is in an ultrasound frequency domain;
wherein the microphone assembly further comprises an air-permeable filter member inside or at the first acoustic port; and
wherein the air-permeable filter member is configured to provide acoustic energy dampening at least at a frequency below a resonant frequency of the Helmholtz resonator.

17. The microphone assembly according to claim 1, wherein the carrier comprises a silicon substrate and/or a circuit board.

18. A microphone assembly comprising:
a microphone with a first acoustic port, wherein the microphone is configured to convert acoustic waves received through the first acoustic port into an electric signal;
a filter housing with a second acoustic port; and
a carrier coupled to the microphone and to the filter housing, wherein the carrier and the filter housing together enclose a cavity with a first acoustic passage fluidly connecting the first acoustic port and the second acoustic port, thereby enabling the acoustic waves to propagate from the second acoustic port through the first acoustic passage to the first acoustic port;
wherein the cavity comprises an acoustic chamber and a second acoustic passage;
wherein the second acoustic passage is in fluid communication with the first acoustic passage and with the acoustic chamber, and wherein the acoustic chamber and the second acoustic passage together establish a Helmholtz resonator for suppressing acoustic energy within a first frequency band in the acoustic waves propagating through the first acoustic passage, wherein the first frequency band is in an ultrasound frequency domain;
wherein the carrier has a recess or bore, and wherein the recess or the bore completely or partially accommodates the filter housing.

19. The microphone assembly according to claim 1, wherein the carrier comprises a silicon substrate and/or a microphone housing.

20. A microphone assembly comprising:
a microphone with a first acoustic port, wherein the microphone is configured to convert acoustic waves received through the first acoustic port into an electric signal;
a filter housing with a second acoustic port; and
a carrier coupled to the microphone and to the filter housing, wherein the carrier and the filter housing together enclose a cavity with a first acoustic passage fluidly connecting the first acoustic port and the second acoustic port, thereby enabling the acoustic waves to propagate from the second acoustic port through the first acoustic passage to the first acoustic port;
wherein the cavity comprises an acoustic chamber and a second acoustic passage;
wherein the second acoustic passage is in fluid communication with the first acoustic passage and with the acoustic chamber, and wherein the acoustic chamber and the second acoustic passage together establish a Helmholtz resonator for suppressing acoustic energy within a first frequency band in the acoustic waves propagating through the first acoustic passage, wherein the first frequency band is in an ultrasound frequency domain;
wherein the microphone comprises a silicon substrate and a microphone housing, the microphone housing having a top portion and a peripheral skirt extending from the top portion towards the silicon substrate;
wherein the first acoustic port extends through the top portion of the microphone housing; and
wherein the microphone housing is attached to a first side of the silicon substrate.

21. The microphone assembly according to claim 20, wherein the filter housing is coupled to the first side of the silicon substrate.

22. The microphone assembly according to claim 20, wherein the microphone housing is between the filter housing and the carrier.

23. The microphone assembly according to claim 20, wherein the filter housing surrounds the microphone housing.

24. The microphone assembly according to claim 1, wherein the carrier comprises a microphone housing.

25. The microphone assembly according to claim 1, wherein the microphone comprises a microphone housing.

26. The microphone assembly according to claim 25, wherein the carrier is coupled indirectly to the filter housing via the microphone housing.

27. A listening device comprising the microphone assembly of claim 1.

28. The microphone assembly according to claim 1, wherein the second acoustic passage has a width measured in a direction that is perpendicular to the carrier, the width of the second acoustic passage being larger than a wall thickness of a central portion of the filter housing.

29. A microphone assembly comprising:
- a microphone with a first acoustic port, wherein the microphone is configured to convert acoustic waves received through the first acoustic port into an electric signal;
- a filter housing with a second acoustic port; and
- a carrier coupled to the microphone and to the filter housing, wherein the carrier and the filter housing together enclose a cavity with a first acoustic passage fluidly connecting the first acoustic port and the second acoustic port, thereby enabling the acoustic waves to propagate from the second acoustic port through the first acoustic passage to the first acoustic port;
- wherein the cavity comprises an acoustic chamber and a second acoustic passage;
- wherein the second acoustic passage is in fluid communication with the first acoustic passage and with the acoustic chamber, and wherein the acoustic chamber and the second acoustic passage together establish a Helmholtz resonator for suppressing acoustic energy within a first frequency band in the acoustic waves propagating through the first acoustic passage, wherein the first frequency band is in an ultrasound frequency domain; and
- wherein the filter housing comprises a central portion and a peripheral portion, and wherein at least a part of the central portion has a first wall part, and at least a part of the peripheral portion has a second wall part, and wherein the first wall part of the at least the part of the central portion and the second wall part of the at least the part of the peripheral portion has a same thickness.

* * * * *